US006459145B1

(12) United States Patent
Yamada et al.

(10) Patent No.: US 6,459,145 B1
(45) Date of Patent: Oct. 1, 2002

(54) SEMICONDUCTOR DEVICE HAVING AN IMPROVED STRUCTURE FOR PREVENTING CRACKS, AND IMPROVED SMALL-SIZED SEMICONDUCTOR

(75) Inventors: Shigeru Yamada, Tokyo (JP); Yasufumi Uchida, Tokyo (JP); Noriko Murakami, Tokyo (JP); Yoshinori Shizuno, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/695,403

(22) Filed: Oct. 25, 2000

Related U.S. Application Data

(62) Division of application No. 09/165,295, filed on Oct. 2, 1998, now Pat. No. 6,177,725, which is a division of application No. 08/736,610, filed on Oct. 24, 1996, now Pat. No. 5,864,174.

(30) Foreign Application Priority Data

| | | |
|---|---|---|
| Oct. 24, 1995 | (JP) | 7-275817 |
| Oct. 24, 1995 | (JP) | 7-275818 |
| Oct. 24, 1995 | (JP) | 7-275819 |
| Oct. 24, 1995 | (JP) | 7-275820 |

(51) Int. Cl.[7] .......... H01L 23/495

(52) U.S. Cl. .......... 257/669; 257/676; 257/781

(58) Field of Search .......... 257/669, 673, 257/676, 781, 790, 666, 674, 751

(56) References Cited

U.S. PATENT DOCUMENTS 4,695,870 A * 9/1987 Patraw .......... 257/700
4,855,869 A * 8/1989 Tsuji .......... 361/807

(List continued on next page.)

FOREIGN PATENT DOCUMENTS

DE 41 31 413 A1 10/1992
DE 41 31 413 A 10/1992
DE 93 08 842.6 9/1993

(List continued on next page.)

OTHER PUBLICATIONS

Susumu Omi et al,. Causes of Cracks in SMD and Type Specific Remedies, IEEE Transactions on Components, Hybrids, and Manufacturing Technology, U.S., IEEE, Inc., NY, vol. 14, No. 4, Dec. 1, 1991, pp. 818–823.

(List continued on next page.)

*Primary Examiner*—Nathan J. Flynn
*Assistant Examiner*—Leonardo Andújar
(74) *Attorney, Agent, or Firm*—Rabin & Berdo

(57) ABSTRACT

According to a typical invention of the inventions disclosed in the present application, a semiconductor chip with an electronic circuit formed therein is fixed to a die pad for a lead frame having projections formed on the back thereof, with an organic dies bonding agent. Pads on the semiconductor chip, and inner leads are respectively electrically connected to one another by metal thin lines. These portions are sealed with a molding resin. Further, each inner lead extends to the outside of the molding resin and is processed into gull-wing form for substrate mounting. Moreover, the inner lead is processed by soldering so that an external terminal is formed. Thus, since the projections are provided on the back of the die pad, the back of a packing material is brought into point contact with that of the die pad as compared with the conventional face-to-face contact. It is therefore possible to minimize the transfer of organic substances from the packing material. Further, since such transfer that a reduction in adhesive property occurs in the back of the die pad, is greatly reduced, the adhesiveness between the upper surface of the die pad and the molding resin is improved, whereby the resistance of SMD to the reflow is enhanced.

16 Claims, 14 Drawing Sheets

U.S. PATENT DOCUMENTS

| | | | | | | |
|---|---|---|---|---|---|---|
| 5,030,796 | A | * | 7/1991 | Swanson et al. | | 257/687 |
| 5,175,610 | A | * | 12/1992 | Kobayashi | | 257/676 |
| 5,216,278 | A | * | 6/1993 | Lin et al. | | 257/673 |
| 5,264,726 | A | * | 11/1993 | Yamaguchi et al. | | 257/729 |
| 5,291,374 | A | * | 3/1994 | Hirata et al. | | 361/760 |
| 5,311,057 | A | * | 5/1994 | McShane | | 257/676 |
| 5,319,241 | A | | 6/1994 | Lim | | |
| 5,436,203 | A | * | 7/1995 | Lin | | 438/126 |
| 5,450,283 | A | * | 9/1995 | Lin et al. | | 257/787 |
| 5,455,456 | A | * | 10/1995 | Newman | | 257/687 |
| 5,467,253 | A | | 11/1995 | Heckman et al. | | |
| 5,477,611 | A | * | 12/1995 | Sweis et al. | | 257/676 |
| 5,496,775 | A | | 3/1996 | Brooks | | |
| 5,508,556 | A | * | 4/1996 | Lin | | 257/691 |
| 5,528,083 | A | * | 6/1996 | Malladi et al. | | 257/786 |
| 5,621,242 | A | * | 4/1997 | Mok et al. | | 257/666 |
| 5,633,785 | A | * | 5/1997 | Parker et al. | | 257/528 |
| 5,686,362 | A | * | 11/1997 | Furuno et al. | | 257/676 |
| 5,789,809 | A | * | 8/1998 | Joshi | | 257/704 |
| 5,866,949 | A | * | 2/1999 | Schueller | | 257/693 |

FOREIGN PATENT DOCUMENTS

| | | | | | |
|---|---|---|---|---|---|
| DE | 94 11 484 | | | 9/1994 | |
| EP | 0 146 330 | | | 12/1984 | |
| EP | 0 740 559 | A1 | | 8/1991 | |
| EP | 0 470 559 | A | | 2/1992 | |
| EP | 0 536 418 | A1 | | 4/1992 | |
| EP | 0 657 921 | A1 | | 10/1994 | |
| EP | 0 664 562 | A1 | | 12/1994 | |
| EP | 0 685 878 | A2 | | 4/1995 | |
| EP | 0 657 921 | A | | 6/1995 | |
| EP | 0 664 562 | A | | 7/1995 | |
| EP | 0 690 500 | A1 | | 1/1996 | |
| JP | 356107565 | | * | 8/1981 | 257/687 |
| JP | 58-199548 | | | 11/1983 | |
| JP | 59 193033 | A | | 11/1984 | |
| JP | 60-1333736 | A | * | 7/1985 | |
| JP | 360165741 | | * | 8/1985 | 257/687 |
| JP | 61-23347 | | | 1/1986 | |
| JP | 61-144046 | A | * | 7/1986 | |
| JP | 62-015844 | A | * | 1/1987 | |
| JP | 62 076747 | A | | 4/1987 | |
| JP | 63 033851 | A | | 2/1988 | |
| JP | 63-65655 | | | 3/1988 | |
| JP | 363205934 | | * | 8/1988 | 257/687 |
| JP | 1-191453 | | | 8/1989 | |
| JP | 02-117162 | A | * | 5/1990 | 257/676 |
| JP | 2-205056 | | | 8/1990 | |
| JP | 02-205351 | A | * | 8/1990 | |
| JP | 03 094438 | A | | 4/1991 | |
| JP | 3-259555 | | | 11/1991 | |
| JP | 4-84452 | | | 3/1992 | |
| JP | 4-46551 | | | 4/1992 | |
| JP | 4-150061 | | | 5/1992 | |
| JP | 4-162736 | | | 6/1992 | |
| JP | 04-163951 | A | * | 6/1992 | 257/676 |
| JP | 05-067722 | A | * | 3/1993 | |
| JP | 05 082677 | A | | 4/1993 | |
| JP | 5-102375 | | | 4/1993 | |
| JP | 05 299530 | A | | 11/1993 | |
| JP | 5-315396 | | | 11/1993 | |
| JP | 6-37127 | | | 2/1994 | |
| JP | 06-029447 | A | * | 2/1994 | 257/676 |
| JP | 06-132443 | A | * | 5/1994 | 257/676 |
| JP | 6-151682 | | | 5/1994 | |
| JP | 6-209055 | | | 7/1994 | |
| JP | 06-209067 | A | * | 7/1994 | 257/676 |
| JP | 6-232208 | | | 8/1994 | |
| JP | 07 122677 | A | | 5/1995 | |
| WO | WO 96 12296 | A | | 4/1996 | |

OTHER PUBLICATIONS

D.A. Tribbey et al., Silicon–Carbon Resin (Glob Top) Over Silicone Die Coat for Reduced Stress Encapsulation, Motorola Technical Developments, vol. 15, May 1, 1992, p. 119.

R. Pennisi et al., A New Liquid Encapsulant for IC Packaging, Proceedings of the Electronic Components and Technology Conference (ECTC), San Diego, CA, May 18–20, 1992, pp. 1015–1017.

Suwa Motoo et al, Development of a New Flip–Chip Bonding Process Using Multi–Stacked –AU Bumps, Proceedings of the Electronic Components and Technology Conference, Washington, DC, May 1–4, 1994, pp. 906–909.

T.A. Scharr, Multi–Metal Ball Bumps for Integrated Circuit Flip Chip Interconnections, Motorola Technical Developments, vol. 14, Dec. 1, 1991, p. 41.

Proceedings of the Electronic Components and Technology Conference, Washington, May 1–4, 1994, no. Conf 44, May 1, 1994, Institute of Electrical and Electronics Engineers, Development of a New Flip–Chip Bonding Process using Multi–Stacked $\mu$–Au Bumps, pp. 906–909.

Motorola Technical Developments, vol. 14, Dec. 1, 1991, "Multi–Metal Ball Bumps for Integrated Circuit Flip Chip Interconnections", p. 41.

Proceedings of the Electronic Components and Technology Conference, San Diego, May 18–20, 1992, no. Conf. 42, May 18, 1992, Institute of Electrical and Electronics Engineers, A New Liquid Encapsulant For IC Packaging, pp. 1015–1017.

Motorola Technical Developments, vol. 15, May 1, 1992, "Silicon–Carbon Resin (Glob Top) Over Silicone Die Coat For Reduced Stress Encapsulation", p. 119.

Patent Abstracts of Japan, vol. 17, No. 415, Aug. 3, 1993 & JP 05 082677 A (Sanyo Electric Co. Ltd.), Apr. 2, 1993.

Patent Abstracts of Japan, vol. 095, No. 008, Sep. 29, 1995 & JP 07 122677 A (Hitachi Ltd; others: 01), May 12, 1995.

Patent Abstracts of Japan, vol. 011, No. 277, Sep. 8, 1987 & JP 62 076747 A (Shindengen Electric Mfg. Co., Ltd.) Apr. 8, 1987.

Patent Abstracts of Japan, vol. 009, No. 053, Mar. 7, 1985 & JP 59 193033 A (Matsushita Denki Sangyo KK), Nov. 1, 1984.

Patent Abstracts of Japan, vol. 015, No. 277, Jul. 15, 1991 & JP 03 094438 A (Shinko Electric Ind. Co., Ltd., Apr. 19, 1991).

Patent Abstracts of Japan, vol. 012, No. 244, Jul. 9, 1988 & JP 63 033851 A (Matsushita Electric Works, Ltd.), Feb. 13, 1988.

Patent Abstracts of Japan, vol. 018, No. 095, Feb. 16, 1994 & JP 05 299530 A (Oki Electric Ind. Co. Ltd.), Nov. 12, 1993.

Anti–Crack Method for Semiconductor Package, pp. 409–410, IBM Technical Diclosure Bulletin, vol. 39, No. 02, Feb. 1996.

* cited by examiner (a)

(b)

(a)

(b)

SEMICONDUCTOR DEVICE HAVING AN IMPROVED STRUCTURE FOR PREVENTING CRACKS, AND IMPROVED SMALL-SIZED SEMICONDUCTOR

This is a divisional of application Ser. No. 09/165,295, filed Oct. 2, 1998 now U.S. Pat. No. 6,177,725 which was a divisional of application Ser. No. 08/736,610, filed on Oct. 24, 1996. now U.S. Pat. No. 5,864,174.

BACKGROUND OF THE INVENTION

1. Field of the Invention

This invention relates to a semiconductor device having a structure capable of preventing cracks produced due to various stresses.

Further, another invention of the present application relates to a semiconductor device capable of being reduced in size and a method of manufacturing the semiconductor device.

2. Description of the Related Art

In order to prevent cracks produced in a semiconductor device, techniques described in, for example, Japanese Patent Application Laid-Open Nos. 2-17162 (laid open on May 1, 1990), 2-205351 (laid open on Aug. 15, 1990), 3-259555 (laid open on Nov. 19, 1991), 1-191453 (laid open on Aug. 1, 1989), 4-84452 (laid open on Mar. 17, 1992) and 6-209055 (laid open on Jul. 26, 1994) have been proposed.

Further, techniques described in, for example, Japanese Patent Application Laid-Open Nos. 4-162736 (laid open on Jun. 8, 1992) and 6-37127 (laid open on Feb. 10, 1994) and Japanese Utility Model Application Laid-Open No. 4-46551 (laid open on Apr. 21, 1992) have been proposed to realize a small-sized semiconductor device.

SUMMARY OF THE INVENTION

With the foregoing in view, it is an object of the invention in the present application to provide various structures capable of preventing cracks produced in a semiconductor device.

It is an object of another invention in the present application to provide a small-sized semiconductor device and a method of manufacturing the semiconductor device.

According to the invention of the present application, for achieving the above objects, a lead frame equipped with a semiconductor device is provided with an improved structure, or an improved connection structure is applied to a connection between a semiconductor element and a substrate provided within a semiconductor device. As an alternative to this, a stress relaxing material is provided between a substrate equipped with a semiconductor element and a sealing resin.

Further, according to another invention of the present application, there has been proposed a structure in which metal thin lines extending from metallic balls respectively connected to electrodes of a semiconductor element are exposed from the surface of a sealing material and the surface of each exposed metal thin line has a width substantially equal to the diameter of each metal thin line.

Here, the typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects, features of the invention and further objects, features and advantages thereof will be better understood from the following description taken in connection with the accompanying drawings in which:

FIGS. 1*a* and 1*b* are views showing the structure of a die pad for a lead frame showing a first embodiment of the present invention;

FIGS. 10*a*, 10*b*, 10*c*, 10*c*-1, 10*c*-2, 10*d*-1, and 10*d*-2 are views for describing a mechanism of occurrence of a failure due to reflow;

DETAILED DESCRIPTION OF THE PREFERRED EMBODIMENTS

Preferred embodiments of the present invention will hereinafter be described in detail with reference to the accompanying drawings.

Figure 1:
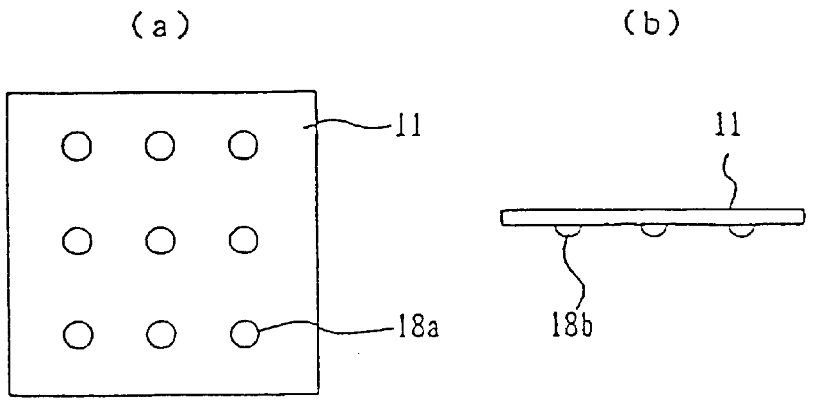

FIG. 1 is a view showing the structure of a die pad for a lead frame showing a first embodiment of the present invention, wherein FIG. 1(*a*) is a top plan view showing the die pad for the lead frame and FIG. 1(*b*) is a side view showing the die pad for the lead frame.

As shown in these drawings, a plurality of concave portions 18*a* are formed on the upper surface of the die pad 11 of the lead frame and a plurality of projections 18*b* are formed on the back of the die pad 11.

The concave portions and the projections, is used wherein they can be formed simultaneously upon dipless processing effected on the die pad 11.

Figure 2:
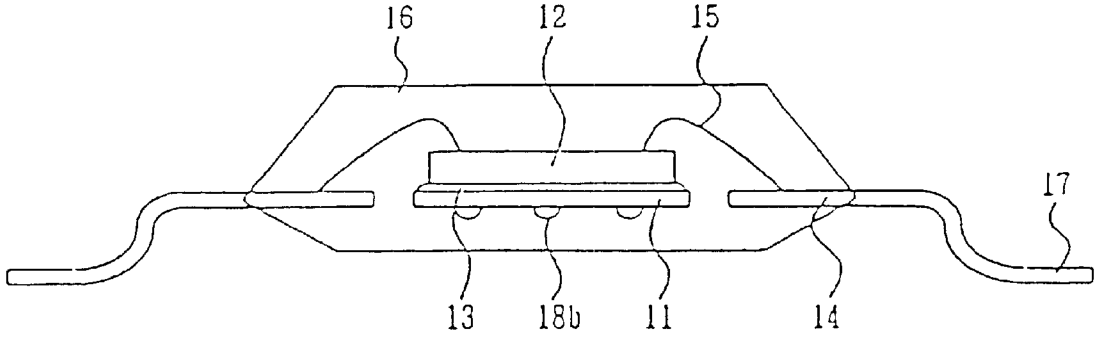
FIG. 2 is a cross-sectional view of a semiconductor device (SMD) using the lead frame shown in FIG. 1.

FIG. 2 is a cross-sectional view of a surface-mounting semiconductor device (SMD) using the lead frame according to the first embodiment of the present invention.

A general surface-mounting semiconductor device will now be described to provide easy understanding of the present invention.

Figure 9:
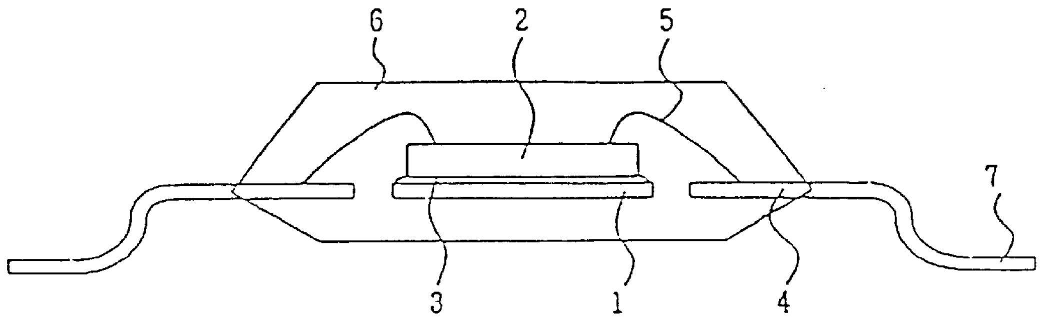
FIG. 9 is a cross-sectional view of a conventional semiconductor device (SMD)

FIG. 9 is a cross-sectional view of such a conventional semiconductor device (SMD).

Referring to FIG. 9, a semiconductor chip 2 with an electronic circuit formed therein is fixed to a die pad 1 with an organic dies bonding material or agent 3. Pads (not shown) on the semiconductor chip 2, and inner leads 4 are respectively electrically connected to one another by metallic thin lines 5. These portions are sealed with a molding resin 6.

Further, the inner leads 4 extend to the outside of the molding resin 6 and are processed into gull-wing form for substrate mounting. Furthermore, the inner leads 4 are processed by soldering to thereby form external terminals 7.

There may be also cases in which in order to make an improvement in the resistance to reflow to be described later, dimples (not shown) are formed on the back of the die pad 1 and countermeasures (also not shown) for defining through holes and slits in the die pad 1 are taken.

However, the above-described conventional semiconductor device (SMD) has a problem that variations in the resistance to the reflow occur according to assembly lots in the case of a thin package in which the thickness of a molding resin is less than or equal to 1.2 mm in particular. In determining its cause, it was found that a very small quantity of paraffin components contained in a lead frame packing material were transferred to the lead frame.

In order to solve such a problem, the packing material is maybe changed and the application of the present device to a metallic case or the like has been proposed. However, either case will increase costs and does not provide a satisfactory solution to the problem.

The dimples, through-holes and slits for improving the resistance to the reflow can provide expectation of effects for a mode A to be described later. However, since the die pad is reduced in rigidity in regard to a mode B, a technically-satisfactory one cannot be obtained.

The term "resistance to reflow" described herein means the limit that the SMD is capable of resisting stresses to which it is subject upon actual substrate mounting. As an evaluating method, the following one is known. Namely, after the SMD is subjected to moisture absorption under desired conditions, and a predetermined temperature profile is placed on the SMD so as to extend over the entire package by an IR reflow device or a VPS device. Next, external cracks of a molding resin are evaluated from the outward appearance, internal cracks are evaluated by a section hierarchical method or a SAT (Supersonic Crack Test), and the property of adhesion between respective interfaces is evaluated by the SAT or a zyglo method to thereby determine the resistance to the reflow.

Figure 10:
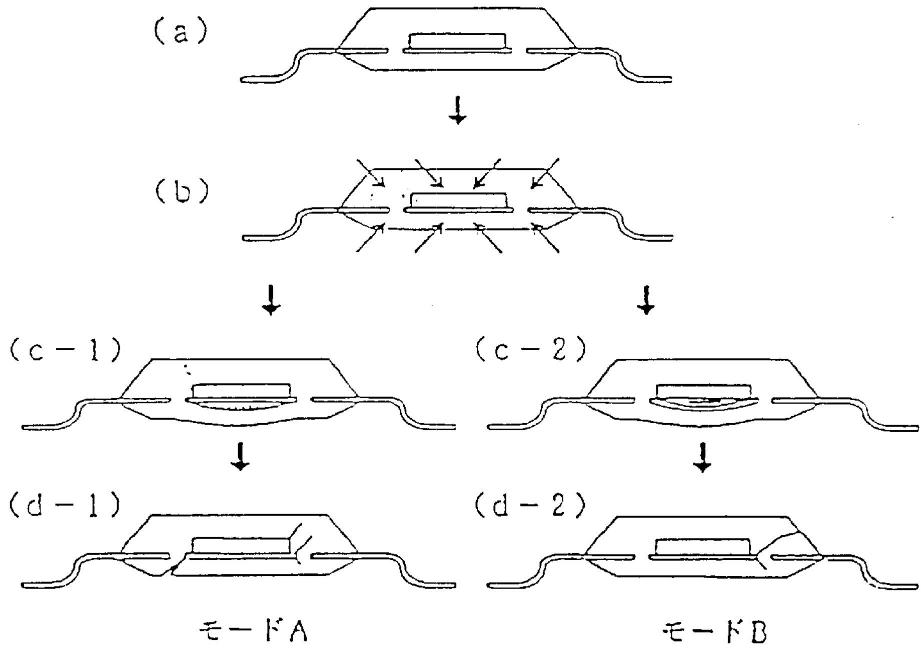

FIG. 10 is a view showing a mechanism in which a failure occurs due to the reflow.

When a plastic package shown in FIG. 10(*a*) is used, it takes up moisture from the atmosphere during its storage as shown in FIG. 10(*b*). The absorbed moisture is expanded by heat generated during substrate mounting, and thereby failures such as peeling of each interface, cracks, etc. occur.

As described in the mode A, cracks [see FIG. 10(*d*-1)] have heretofore been produced principally due to the peeling and moisture expansion [see FIG. 10(*c*-1)] with the back of the die pad defined as the starting point. However, a so-called mode B occurs in which due to the application of a dimple, through-hole and slit approaches to the die pad and an improvement in molding resin, a dies bonding agent takes up moisture to thereby produce cracks [see FIG. 10(*d*-2)] due to the separation of adhesive layers or breakdown/moisture expansion thereof [see FIG. 10(*c*-2)].

On the other hand, the present invention provides a lead frame capable of solving the above-described problems and preventing the occurrence of the cracks due to the peeling of the adhesive layer or breakdown/moisture expansion thereof due to the moisture absorption of the dies bonding agent, and a semiconductor device using the lead frame.

Namely, as shown in FIG. 2, a semiconductor chip 12 with an electronic circuit formed therein is fixed to a die pad 11 for a lead frame having projections 18*b* formed on the back thereof, with an organic dies bonding agent 13. Pads (not shown) on the semiconductor chip 12, and inner leads 14 are respectively electrically connected to one another by metal thin lines 15. These portions are sealed with a molding resin 16, which completely encapsulates the die pad 11 and the chip 12, but which doesn't enter the on cave portions 18*a* due to the presence of the chip 12 and the bonding agent 13. Further, each inner lead 14 extends to the outside of the molding resin 16 and is processed into gull-wing form for substrate mounting. Moreover, the inner lead 14 is processed by soldering so that an external terminal 17 is formed.

Thus, since the projections 18*b* are provided on the back of the die pad 11, the back of a packing material is brought into point contact with that of the die pad as compared with the conventional face-to-face contact. It is therefore possible to minimize the transfer of organic substances from the packing material.

Further, since such transfer reduces the adhesiveness property occurring in the back of the die pad 11, and since such transfer is greatly reduced, the adhesiveness between the upper surface of the die pad 11 and the molding resin is improved, whereby the resistance of the SMD to the reflow is enhanced.

Figure 3:
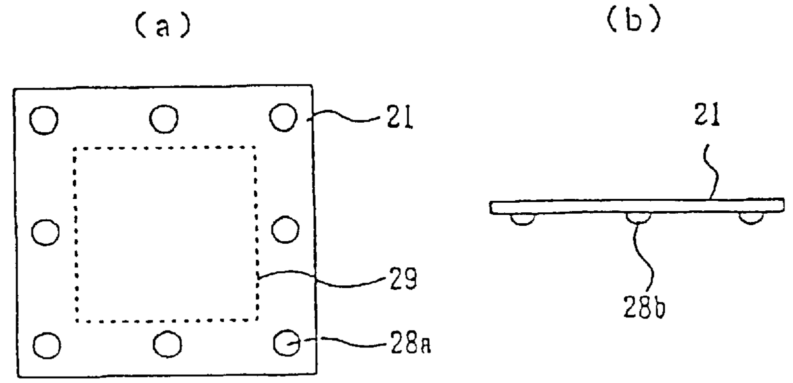
FIGS. 3*a* and 3*b* are views illustrating the structure of a die pad for a lead frame showing a second embodiment of the present invention.

FIG. 3 is a view illustrating the structure of a die pad for a lead frame showing a second embodiment of the present invention, wherein FIG. 3(*a*) is a top plan view of the die pad for the lead frame and FIG. 3(*b*) is a side view of the die pad for the lead frame.

As shown in these drawings, a plurality of concave portions 28*a* are formed on the upper surface of the die pad 21 of the lead frame and a plurality of projections 28*b* are formed on the back of the die pad 21. The concave portions 28*a* are formed so as to avoid a semiconductor chip mounting area 29.

Using the lead frame, the SMD is formed in accordance with the same process as the first embodiment.

Since the concave portions 18*a* are formed even within the semiconductor chip mounting area in the first embodiment, the amount of bonding agent was required a quantity comparable with the conventional one.

However, since the concave portions 28*a* are formed so as to avoid the semiconductor chip mounting area 29 in the second embodiment, the quantity of the bonding agent can be reduced.

Therefore, the amount of moisture absorbed into the dies bonding agent does not increase and the cost of the SMD will not be high either. Even if this structure is adopted, the transfer of organic substances from the packing material can be controlled to a minimum.

Accordingly, the bonding of the back of the die pad 21 to a molding resin is improved. Further, since water vapor pressure developed upon reflow becomes identical to that in the conventional example, the SMD can make a further improvement in the resistance to the reflow.

Figure 4:
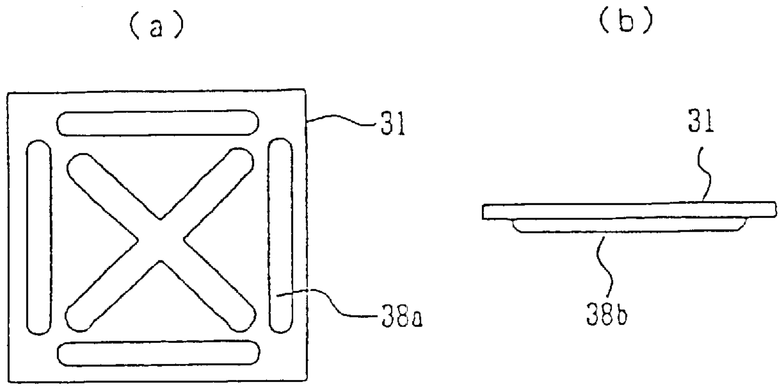
FIGS. 4*a* and 4*b* are views depicting the structure of a die pad for a lead frame showing a third embodiment of the present invention.

FIG. 4 is a view showing the structure of a die pad for a lead frame showing a third embodiment of the present invention, wherein FIG. 4(*a*) is a top plan view of the die pad for the lead frame and FIG. 4(*b*) is a side view of the die pad for the lead frame.

As shown in these drawings, a plurality of grooves 38*a* are defined in the die pad 31 so that a convex ridge 38*b* is formed on the back of the die pad 31 for the lead frame. The grooves and the convex ridge can be formed simultaneously upon dipless processing on the die pad 31.

Figure 5:
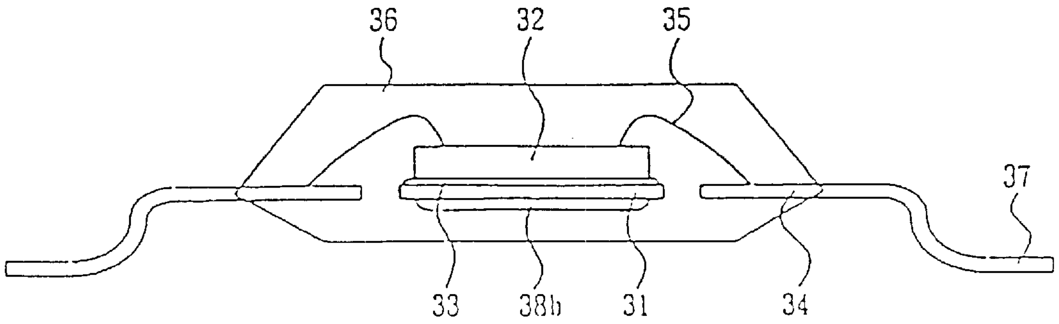
FIG. 5 is a cross-sectional view of a semiconductor device (SMD) using the lead frame shown in FIG. 4.

FIG. 5 is a cross-sectional view of a semiconductor device (SMD) using the lead frame according to a third embodiment of the present invention.

As shown in the same drawing, a semiconductor chip 32 with an electronic circuit formed therein is fixed to the die pad 31 of the lead frame, which has the convex ridge 38*b* formed on the back thereof with an organic dies bonding agent 33. Pads (not shown) on the semiconductor chip 32, and inner leads 34 are respectively electrically connected to one another by metal thin lines 35. These portions are sealed with a molding resin 36. Further, each inner lead 34 extends to the outside of the molding resin 36 and is processed into gull-wing form for substrate mounting. Moreover, the inner lead 34 is processed by soldering so that an external terminal 37 is formed.

Owing to the above-described construction, the back of a packing material is brought into contact with the die pad 31 along a line as compared with the conventional face-to-face contact because the convex ridge 38*b* is formed on the back of the die pad 31. It is therefore possible to minimize the transfer of organic substances from the packing material. Further, since the convex ridge 38*b* is formed on the back of the die pad 31, the rigidity of the die pad 31 is improved and its resistant to a stress developed upon reflow is greater. It is therefore possible to prevent cracks from occurring (reflow failure mode B).

Accordingly, the property of bonding of the back of the die pad 31 to the molding resin is improved and the resistance of the SMD to the reflow is enhanced because of the high rigidity of the die pad 31.

Figure 6:
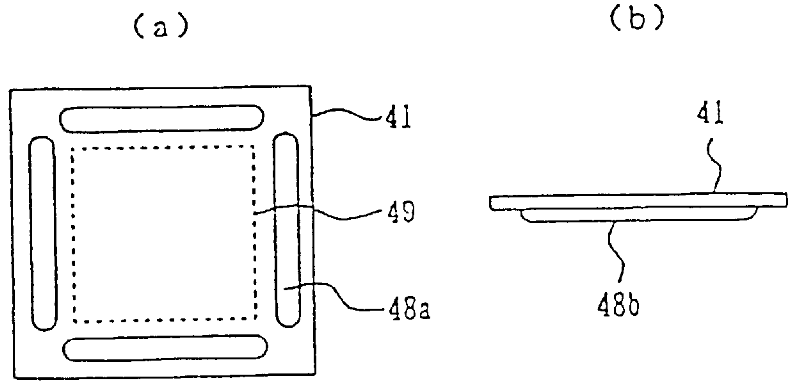
FIGS. 6*a* and 6*b* are views illustrating the structure of a die pad for a lead frame showing a fourth embodiment of the present invention.
FIGS. 6C and 6D are views showing alternative configurations of the grooves and waves on the die pad.

FIG. 6 is a view illustrating the structure of a die pad for a lead frame according to a fourth embodiment of the present invention, wherein FIG. 6(*a*) is a top plan view of the die pad for the lead frame and FIG. 6(*b*) is a side view of the die pad for the lead frame.

As shown in these drawings, a plurality of grooves 48*a* are defined in the die pad 41 for the lead frame so that a convex ridge 48*b* is formed on the back of the die pad 41, i.e., the position of the convex ridge corresponds to a position of a respective groove. The grooves and convex ridge can be formed simultaneously upon dipless processing on the die pad 41.

In this case, the so-defined grooves 48*a* are provided so as to avoid a semiconductor chip mounting area 49.

Using the lead frame, an SMD is formed in accordance with the same process as the third embodiment.

Thus, since the grooves 48*a* are provided so as to avoid the semiconductor chip mounting area 49 in such a manner that the convex ridge 48*b* is formed on the back of the die pad 41, a required amount of a dies bonding agent is identical in quantity to the conventional one.

Therefore, the amount of moisture absorbed into the dies bonding agent does not increase and the cost of the SMD will not be high either. Even if this structure is adopted, the transfer of organic substances from a packing material can be controlled to a minimum and the rigidity of the die pad 41 can be also increased.

Accordingly, the property of bonding of the back of the die pad 41 to a molding resin is improved and the die pad 41 increases in rigidity. Further, since water vapor pressure developed upon reflow also becomes identical to that in the conventional example, the resistance of the SMD to the reflow can be further improved.

Figure 7:
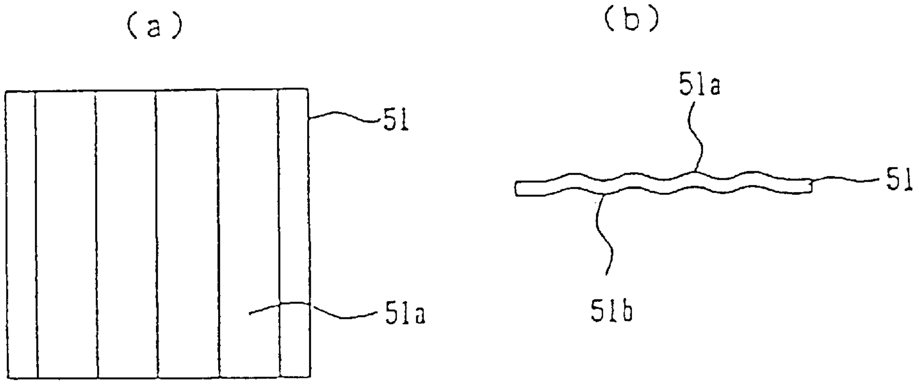
FIGS. 7*a* and 7*b* are views depicting the structure of a die pad for a lead frame showing a fifth embodiment of the present invention.

FIG. 7 is a view illustrating the structure of a die pad for a lead frame showing a fifth embodiment of the present invention, wherein FIG. 7(*a*) is a top plan view of the die pad for the lead frame and FIG. 7(*b*) is a side view of the die pad for the lead frame.

As shown in these drawings, a wave-shaped portion is formed over the entire surface of the die pad 51 for the lead frame. Namely, a wave top 51*a* and a wave bottom 51*b* are formed. The wave top and wave bottom can be formed simultaneously upon dipless processing on the die pad 51.

Figure 8:
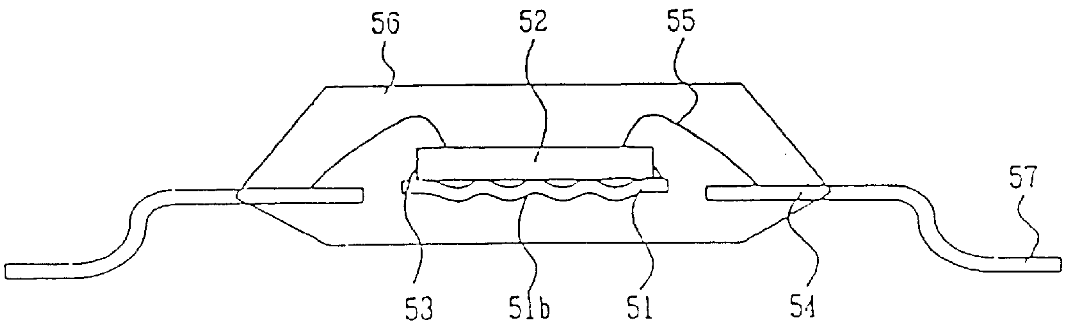
FIG. 8 is a cross-sectional view of a semiconductor device (SMD) using the lead frame shown in FIG. 7.

FIG. 8 is a cross-sectional view of a semiconductor device (SMD) using the lead frame according to the fifth embodiment of the present invention.

As shown in the same drawing, a semiconductor chip 52 with an electronic circuit formed therein is fixed to the die pad 51 for the lead frame, which has the wave bottom 51 b formed on the back thereof, with an organic dies bonding agent 53. Pads (not shown) on the semiconductor chip 52, and inner leads 54 are respectively electrically connected to one another by metal thin lines 55. These portions are sealed with a molding resin 56. Further, each inner lead 54 extends to the outside of the molding resin 56 and is processed into gull-wing form for substrate mounting. Moreover, the inner lead 54 is processed by soldering so that an external terminal 57 is formed.

Due to the above-described construction, the back of a packing material is brought into contact with of the die pad 51 along a line as compared with the conventional face-to-face contact because the wave bottom 51*b* is formed on the back of the die pad 51. It is therefore possible to minimize the transfer of organic substances from the packing material.

In the present embodiment, the wave-shaped portion is formed over the entire surface of the die pad 51. However, the wave-shaped portion may be partially formed. When the wave-shaped portion is formed so as to avoid a semiconductor chip mounting area, for example, the present embodiment can bring about the same effect as that obtained in the third or sixth embodiment.

Further, the present invention can have the following forms.

(1) The first and second embodiments show the case in which projections are provided as the semi-spherical forms. However, they may be polygonal poles. The shape of each projection is not specified. Similarly, the number of the projections is not specified either.

(2) The third and fourth embodiments show the case in which the cross-section of each groove is semi-spherical. However, the groove may be V-shaped as shown in FIGS. 6C and 6D or U-shaped. The shape of the groove is not specified. The individual grooves may be provided separately or continuously. Further, the grooves may run across the die pad, or wave-shaped configurations may be used without sticking to the grooves. Similarly, the number of the grooves is not specified either.

(3) The first through fourth embodiments have described a method of forming the projections and the grooves simultaneously, with a dipless forming process on the die pad. However, they may be formed in accordance with another process. If a press-processed frame is used, then they may be formed in accordance with a process applied upon the formation of inner leads and a die pad prior to being subjected to a plating process. The method of forming them is not specified or identified.

According to the above-described construction, the following advantageous effects can be brought about:

(1) Since projections are provided on the back of a die pad, the transfer of organic substances from a packing material can be controlled.

Further, the property of bonding of the back of the die pad to a molding resin is improved and the resistance to reflow can be stabilized (variations do not occur depending on assembly lots).

(2) Since the projections can be provided on the back of a die pad so as to avoid a semiconductor chip mounting area on the back thereof, the amount of a dies bonding agent can be identical to the conventional one and a further improvement in the resistance to the reflow can achieved.

(3) Since a reduction in the adhesive properties occurring in the back of a die pad is greatly reduced, the adhesiveness between the upper surface of the die pad and a molding resin is improved and the resistance of an SMD to the reflow is enhanced.

(4) Since a convex ridge can be formed on the back of a die pad, the property of bonding of the back of the die pad to a molding resin can be enhanced by restricting the transfer of organic substances from a packing material. Further, the resistance to reflow can be improved with an increase in rigidity of the die pad.

(5) Since the convex ridge can be provided on the back of the die pad so as to avoid a semiconductor chip mounting area, the amount of a dies bonding agent can be reduced and the resistance to the reflow can be further enhanced.

(6) Since the convex ridge can be provided on the back of the die pad, the back of the packing material is brought into line contact with that of the die pad as compared with the conventional face-to-face contact. Therefore, the transfer of organic substances from the packing material can be controlled to a minimum. Further, the rigidity of the die pad can be improved because the convex ridge is formed. Furthermore, since a force resistant to a stress developed upon reflow becomes strong, cracks can be prevented from occurring.

(7) Since a wave-shaped portion can be formed on a die pad, the property of bonding of a molding resin to the back of the die pad can be enhanced by controlling the transfer of organic substances from a packing material, and the resistance to reflow can be enhanced owing to an improvement in the rigidity of the die pad.

Sixth through eighth embodiments will next be described below.

Figure 11:
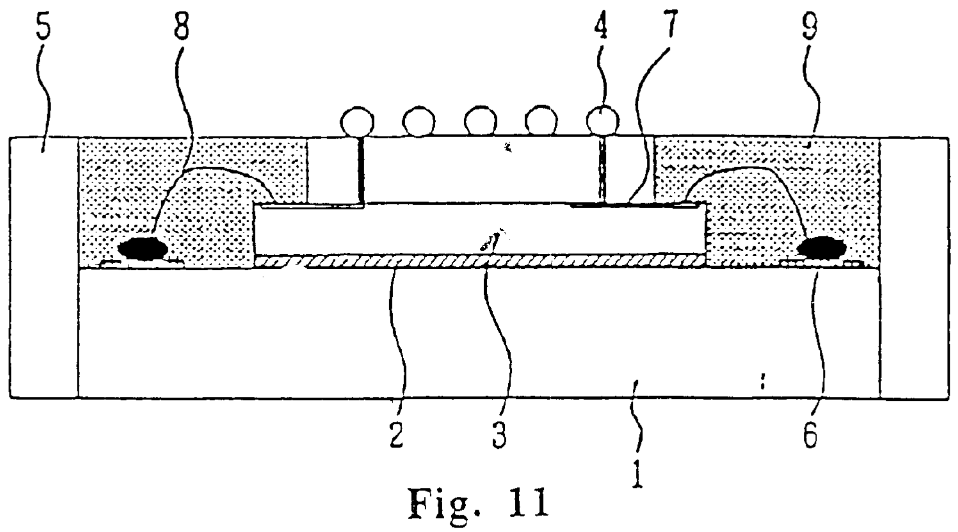
FIG. 11 is a cross-sectional view of a semiconductor device showing a sixth embodiment of the present invention.

FIG. 11 is a cross-sectional view of a semiconductor device showing the sixth embodiment of the present invention.

As shown in the drawing, necessary patterns are formed in advance on a semiconductor element 1 through a thermosetting or thermoplastic adhesive layer 2. Further, a substrate 3 composed of plastic such as a glass epoxy or the like, or ceramic which is reduced by about 0.5 mm to 2.0 mm in thickness as compared with the semiconductor element 1 with soldering balls 4 formed on one surface thereof, is fixed to the semiconductor element 1 with the adhesive layer 2 interposed therebetween. A conveying or sealing frame 5 is provided around the semiconductor element 1. Electrodes 6 on the semiconductor element 1 and conductors 7 on the substrate 3 are respectively connected to one another by metal wires 8. Further, they are sealed with a resin 9 so that the metal wires 8 be covered therewith Since the present embodiment is constructed in this way, a signal is input to and output from the semiconductor element 1 through the soldering balls 4, the substrate 3 and the metal wires 8 when the semiconductor device is connected to a mother board by soldering with reflow (IR, VPS, air or the like) and is activated. At this time, the semiconductor element 1 generates heat to thereby produce a thermal distortion. Alternatively, the semiconductor element 1 produces thermal and mechanical distortions due to external environments. However, since the substrate 3 and the adhesive layer 2 serve as cushioning materials. and the electrical connection between the substrate 3 and the semiconductor element 1 is provided by the metal wires 8, a stress applied to a connecting portion between the semiconductor element 1 and each metal wire 8 can be minimized.

Further, the present device can be rendered resistant to variations in source voltage and the like by constructing the substrate 3 in a multilayer form i.e., by providing substrate 3*a* which is smaller in area than the semiconductor element 1, and substrate 3*b* which is smaller in area than substrate 3*a*. As such, substrate 3*a* forms a step-like transition with semiconductor element 1, and substrate 3*b* forms a step-like transition with substrate 3*a*.

The seventh embodiment of the present invention will next be described.

Figure 12:
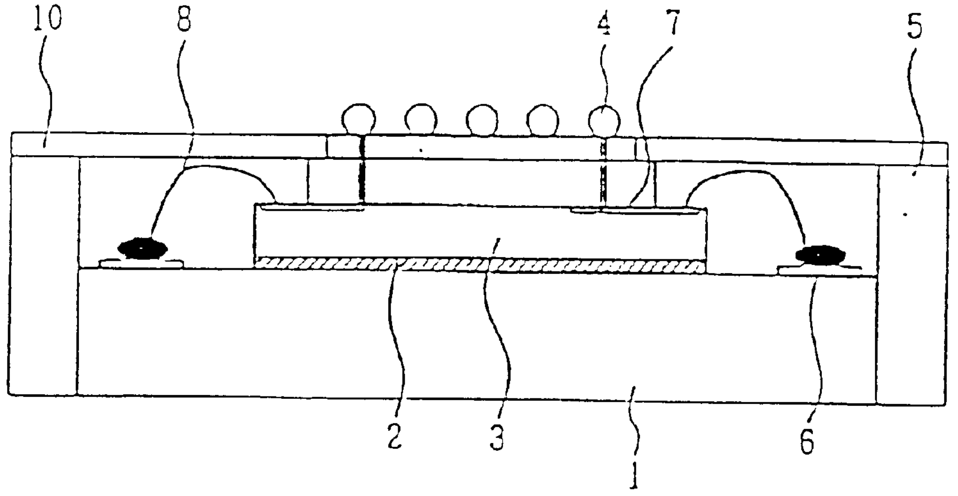
FIG. 12 is a cross-sectional view of a semiconductor device showing a seventh embodiment of the present invention.

FIG. 12 is a cross-sectional view of a semiconductor device showing the seventh embodiment of the present invention.

As shown in the same drawing, a substrate 3 is bonded onto a semiconductor element 1 with an adhesive layer 2 interposed therebetween. A sealing frame 5 is provided and electrodes 6 on the semiconductor element 1 and conductors 7 on the substrate 3 are respectively electrically connected to one another by metal wires 8. A structure provided till now is identical to that employed in the first embodiment.

Thereafter, a plastic or metallic cap 10, which has been processed into a predetermined shape in advance, is bonded to the sealing frame 5 and the substrate 3 through a junction layer.

Since the present embodiment is constructed in this way, the semiconductor element 1 produces a thermal distortion in a manner similar to the first embodiment when power is turned ON after the present device has been mounted to a mother board. However, since the interior of the semiconductor device is shaped in the form of a hollow structure, no stress is applied to a connecting portion between each electrode 6 on the semiconductor element 1 and its corresponding metal wire 8 and a connecting portion between each conductor 7 on the substrate 3 and its corresponding metal wire 8, whereby the reliability of connection is improved.

The eighth embodiment of the present invention will next be described.

Figure 13:
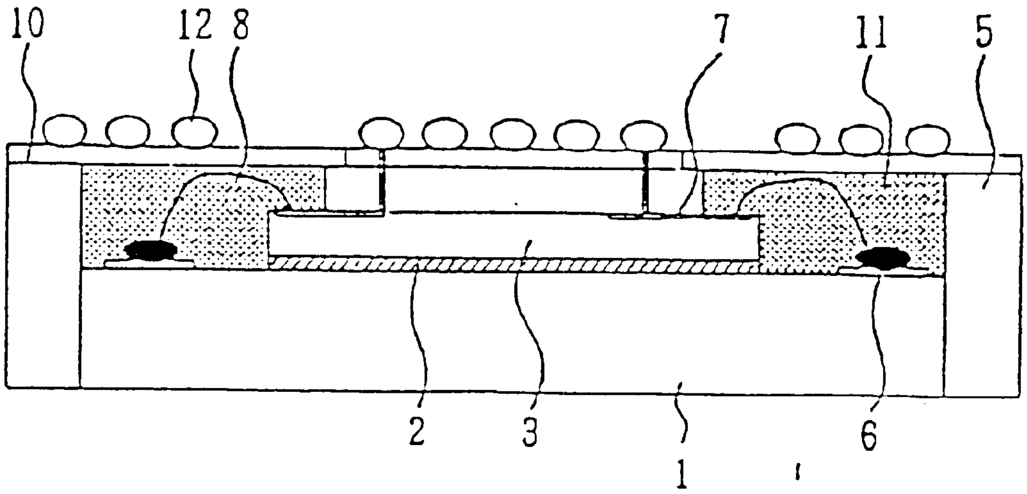
FIG. 13 is a cross-sectional view of a semiconductor device showing an eighth embodiment of the present invention.

FIG. 13 is a cross-sectional view of a semiconductor device showing the eighth embodiment of the present invention. The same elements of structure as those employed in the sixth and seventh embodiments are identified by the same reference numerals and their description will be omitted.

In the present embodiment, as shown in FIG. 3, a thermal conductive epoxy resin 11 is charged into the inside of the semiconductor device and solder balls are provided on a metallic or plastic cap 10 in addition to the seventh embodiment.

Since the present embodiment is constructed in this way, a semiconductor element 1 generates heat and thereby produces a thermal distortion in the same manner as the first and second embodiments when power is turned ON after the present device has been installed on a mother board. However, since the interior of the semiconductor device is filled with the thermal conductive epoxy resin 11 and the solder balls 12 are formed on the cap 10, the generated heat is dissipated into the mother board from the thermal conductive epoxy resin 11 and the cap 10 through the solder balls 12. As a result, the thermal distortion can be reduced.

Thus, according to the constructions of the sixth through eighth embodiments, the following advantageous effects can be brought about:

(1) Since a substrate is bonded onto a semiconductor element with an adhesive layer interposed therebetween, and electrodes on the semiconductor element and conductors on the substrate are respectively electrically connected to one another by metal wires, a semiconductor device can be rendered high resistant to the heat generation of the semiconductor element and a thermal stress developed due to external environments. For example, 1000 cycles or more can be achieved on a temperature cycling test.

Since special processing is unnecessary for the semiconductor element, a standard element can be used and new designs and improvements or bumping or the like is necessary. Thus, the semiconductor device can offer high general versatility.

Further, since solder balls are formed on the substrate in advance, thermal stresses developed upon formation of the balls can be removed and an improvement in reliability can be achieved. Moreover, the resistance of the semiconductor device to reflow can be enhanced by using ceramic or low moisture-absorbent plastic for the substrate.

(2) Since the interior of the semiconductor device is formed as a hollow structure, the reliability of its internal connections can be greatly improved.

(3) Since the interior of the semiconductor device is filled with a thermal conductive epoxy resin and solder balls are provided on a cap in addition to the above-described effect (2), heat-radiation properties can be enhanced after the semiconductor device has been mounted to a mother board.

It is thus possible to decrease the thermal distortion and improve the reliability of the Internal connections. Further, an improvement in the reliability of electrical connection between the semiconductor device and the mother board can be expected.

Moreover, since the semiconductor element is larger than the substrate, the semiconductor device is not limited in a reduction of its size by the size of the substrate, but instead can be made almost as small as the semiconductor element. It is thus possible to make a smaller semiconductor device.

Ninth and tenth embodiments of the present invention will now be described in detail with reference to the accompanying drawings.

Figure 14:
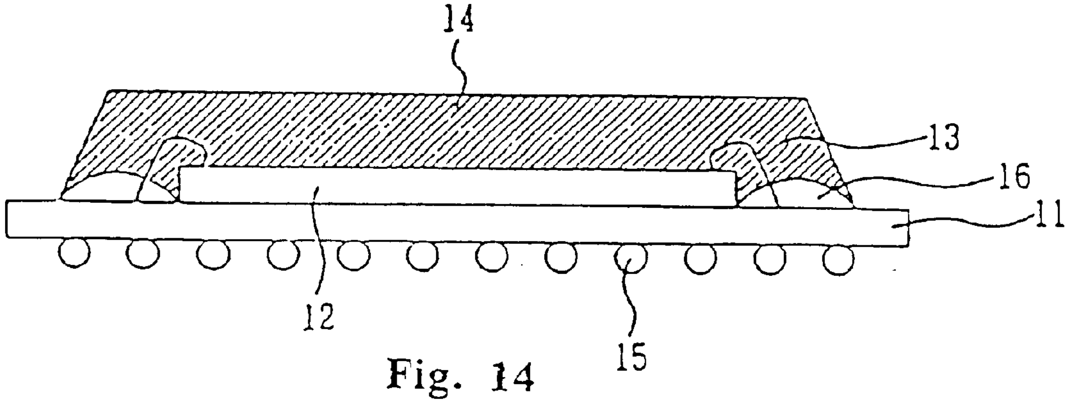
FIG. 14 is a cross-sectional view of a plastic molded type semiconductor device showing a ninth embodiment of the present invention.

FIG. 14 is a-cross-sectional view of a resin seal or plastic molded type semiconductor device showing the ninth embodiment of the present invention.

A semiconductor chip 12 is first formed on a substrate 11 by dies bonding. The semiconductor chip 12 is then wire-bonded to the substrate 11 by Au wires 13. Thereafter, a substance having a high stress relaxing effect, such as silicone or the like is applied onto the substrate 11 lying around the semiconductor chip 12 as a stress relaxing substance or material so as to form stress relaxing portions 16. These portions are heated and hardened as needed and are sealed with a sealing resin 14. Further, solder balls 15 are provided on the side opposite to the substrate 11.

Since the present embodiment is constructed in this way, a stress produced between the sealing resin 14 and the substrate 11 due to the difference between their linear expansion coefficients can be relaxed by the stress relaxing portions 16. As a result, warpage can be reduced.

The tenth embodiment of the present invention will next be described.

Figure 15:
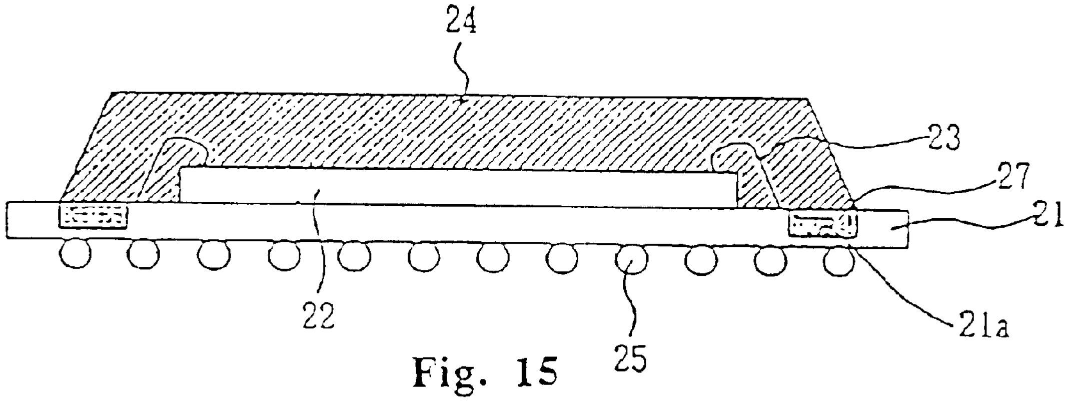
FIG. 15 is a cross-sectional view of a plastic molded type semiconductor device showing a tenth embodiment of the present invention.

FIG. 15 is a cross-sectional view of the resin seal semiconductor device showing the tenth embodiment of the present invention.

In the present embodiment, recesses are defined in a substrate and stress relaxing portions formed by embedding a stress relaxing material in the recesses are provided.

As shown in the same drawing, recesses 21*a* for embedding the stress relaxing material therein are first defined in a substrate 21 and stress relaxing portions 27 are provided therein. A substance such as silicone having a high stress relaxing effect is used as the stress relaxing material. Next, a semiconductor chip 22 is dies-bonded to the substrate 21 having the stress relaxing portions 27 formed by embedding the stress relaxing material in the recesses 21*a*. Further, the semiconductor chip 22 is wire-bonded to the substrate 21 by Au wires 23. Thereafter, these portions are sealed with a sealing resin 24 and solder balls 25 are provided on the side opposite to the substrate 21.

Since the present embodiment is constructed in this way, a stress developed between the sealing resin 24 and the substrate 21 due to the difference between their linear expansion coefficients can be relaxed by the stress relaxing portions 27 formed in the substrate 21. As a result, warpage can be reduced.

According to the above-described construction, the following advantageous effects can be brought about:

(1) Since a stress relaxing material is applied between a substrate on the semiconductor chip side and a sealing resin to thereby form each stress relaxing portion, the stress produced between the sealing resin and the substrate can be relaxed. As a result, warpage can be reduced and the reliability of connection therebetween can be enhanced.

(2) Since the stress relaxing portions formed by embedding the stress relaxing material in the surface of the substrate on the semiconductor chip side are provided, the stress produced between the sealing resin and the substrate can be relaxed. Consequently, warpage can be reduced and the reliability of connection therebetween can be improved.

Eleventh and twelfth embodiments of the present invention will hereinafter be described in detail with reference to the accompanying drawings.

Figure 16:
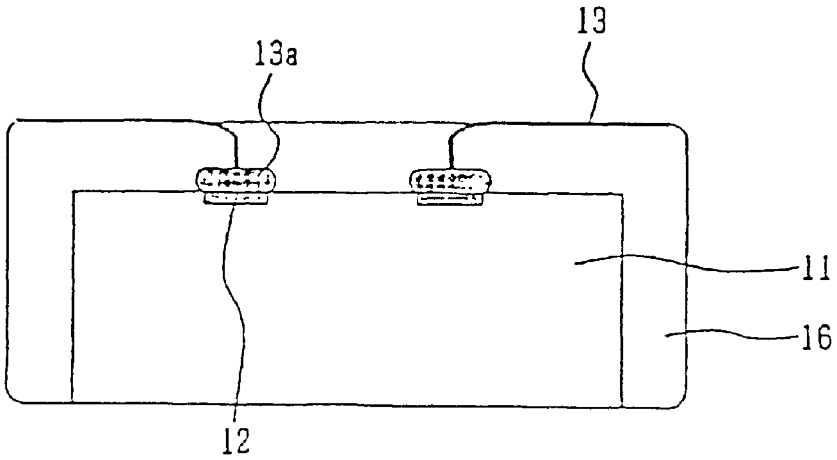
FIGS. 16*a* and 16*b* are configurational views of a semiconductor device showing an eleventh embodiment of the present invention.
Figure 16:
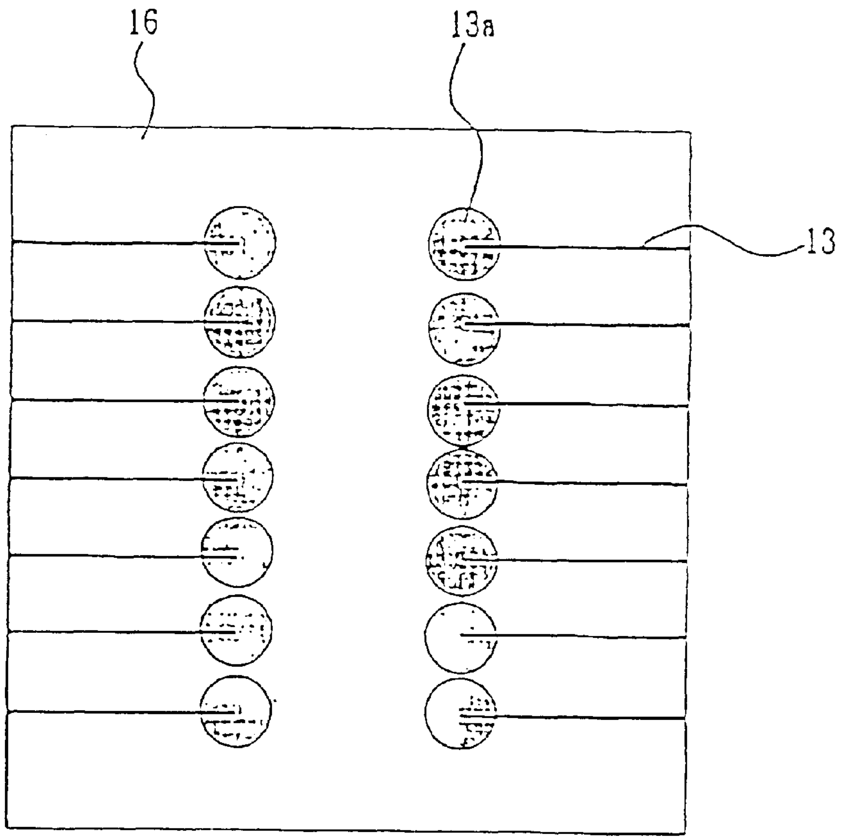

FIG. 16 is a view illustrating the structure of a semiconductor device showing the eleventh embodiment of the present invention, wherein FIG. 16(*a*) is a cross-sectional view of the semiconductor device and FIG. 16(*b*) is a top plan view of the semiconductor device.

As shown in these drawings, a semiconductor element 11 is sealed with a plastic sealing material 16 so that upper portions of metal thin lines 13 respectively electrically connected to electrodes 12 are exposed from the surface of the plastic sealing material 16. At this time, the back of the semiconductor element 11 is also exposed from the lower surface of the plastic sealing material 16. Incidentally, reference numerals 13*a* indicate metallic balls.

Here, the plastic sealing material 16 is formed to the required minimum size to protect the semiconductor element 11.

Figure 17:
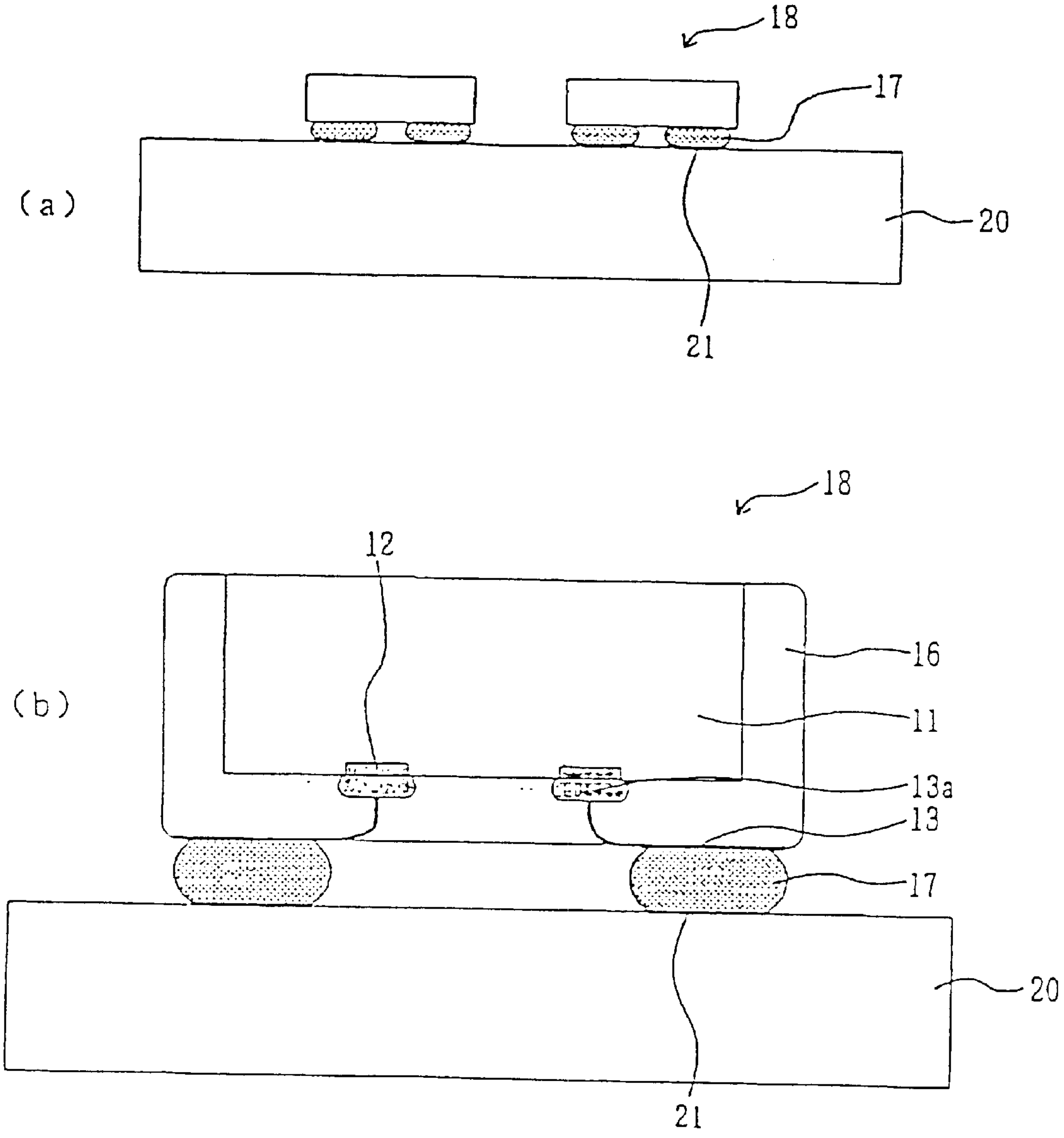
FIGS. 17*a* and 17*b* are cross-sectional views showing the semiconductor device shown in FIG. 16, which has been implemented on a mounting substrate.

FIG. 17 is a cross-sectional view of the semiconductor device of the eleventh embodiment of the present invention, which has been mounted to a mounting substrate, in which FIG. 17(*a*) is a sectional view showing the entire mounting of the semiconductor device to the mounting substrate and FIG. 17(*b*) is an enlarged sectional view showing the manner in which the semiconductor device has been implemented in the mounting substrate.

As shown in these drawings, the semiconductor element 11 is electrically connected to substrate electrodes 21 of a mounting substrate 20 through conductive adhesives 17 while the surface of each metal thin line 13, which has been exposed from the plastic sealing material 16, is being placed down. Here, reference numeral 18 indicates the semiconductor device.

Figure 18:
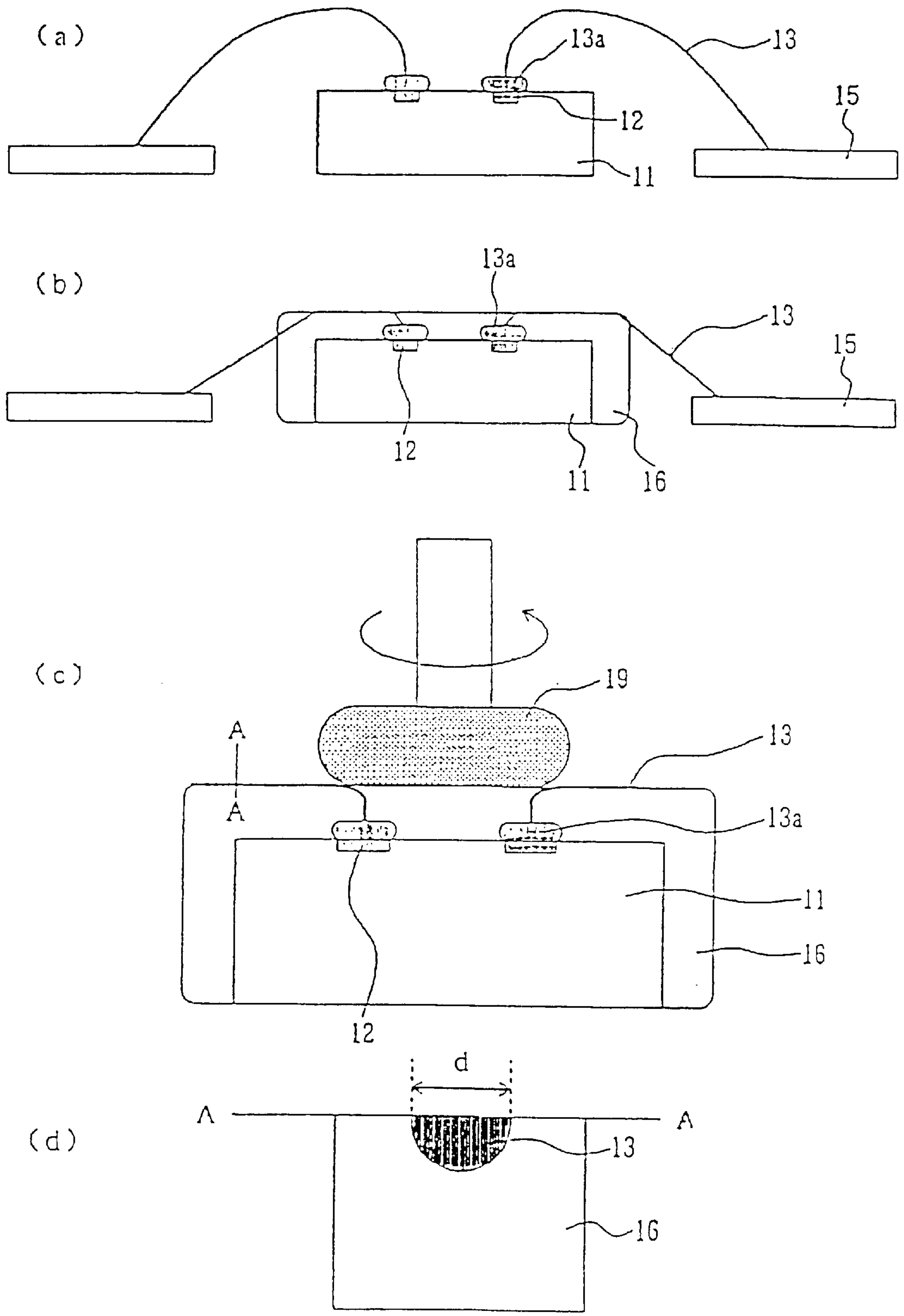
FIGS. 18*a*, 18*b*, 18*c*, and 18*d* are cross-sectional views for describing a process for manufacturing the semiconductor device shown in FIG. 16.

FIG. 18 is a cross-sectional view for describing a process of manufacturing the semiconductor device illustrating the eleventh embodiment of the present invention.

(1) As shown in FIG. 18(*a*), the semiconductor element 11 is electrically connected to leads 15 by the metal thin lines 13 in a die pad-free state. Namely, the semiconductor element 11 is wire-bonded to the leads 15.

(2) Next, as shown in FIG. 18(*b*), the semiconductor element 11 is sealed with the plastic sealing material 16 so that the back of the semiconductor element 11 is exposed. At this time, each metal thin line 13 is held tight by a mold upon sealing so as to take a shape extending along the upper surface of the plastic sealing material 16.

(3) Further, as shown in FIG. 8(*c*), the upper surface of the plastic sealing material 16 is cut away by a polishing machine 19 so that an exposed width of each metal thin line 13 is sufficiently obtained. As viewed from a cross section taken along line A—A in FIG. 17(*c*), a flat width d of each metal thin line 13, which has been exposed from the upper surface of the plastic sealing material 16, is formed as shown in FIG. 18(*d*).

Figure 19:
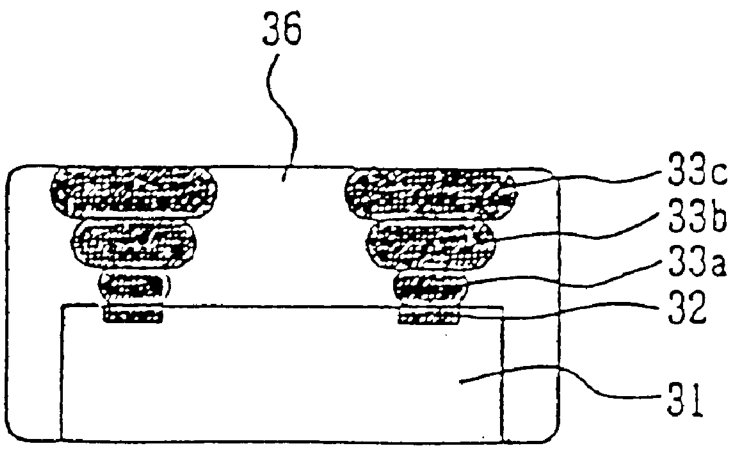
FIGS. 19*a* and 19*b* are views showing the structure of a semiconductor device illustrating a twelfth embodiment of the present invention.
Figure 19:
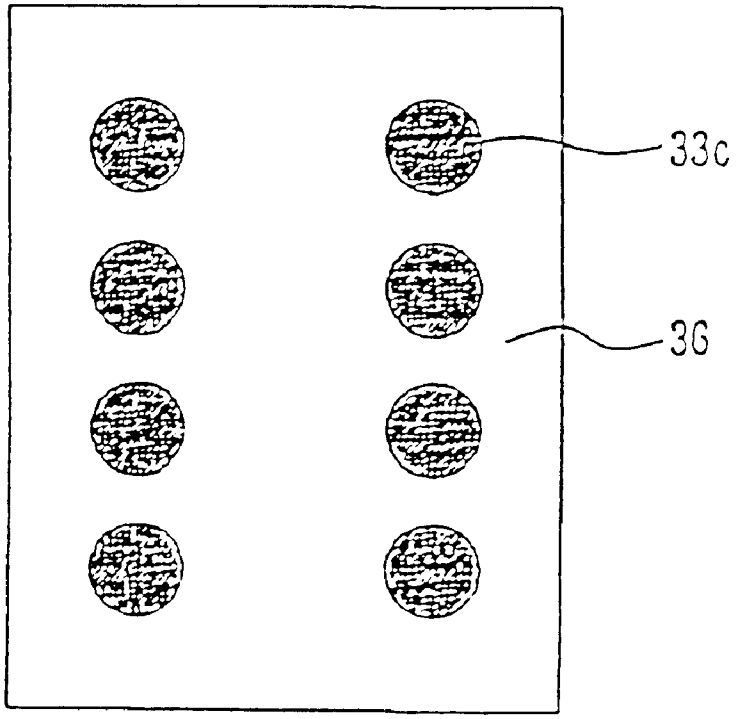

FIG. 19 is a view illustrating the structure of a semiconductor device showing the twelfth embodiment of the present invention, wherein FIG. 19(*a*) is a cross-sectional view of the semiconductor device and FIG. 19(*b*) is a top plan view of the semiconductor device.

As shown in these drawings, a plurality of metallic balls 33*a*, 33*b* and 33*c* are respectively joined or connected to electrodes 32 of a semiconductor element 31. Ones of the metallic balls 33*a*, 33*b* and 33*c*, which are to be joined to the electrodes 32, are formed to the minimum sizes and the subsequent ones thereof are successively increased in size.

The semiconductor element 31 is sealed by a plastic sealing material 36 so that the upper portion of the top metallic ball 33*c* is exposed from the surface of the plastic sealing material 36. At this time, the back of the semiconductor element 31 is also exposed simultaneously from the lower surface of the plastic sealing surface 36.

Here, the plastic sealing material 36 is formed to the required minimum size to protect the semiconductor element 31.

Figure 20:
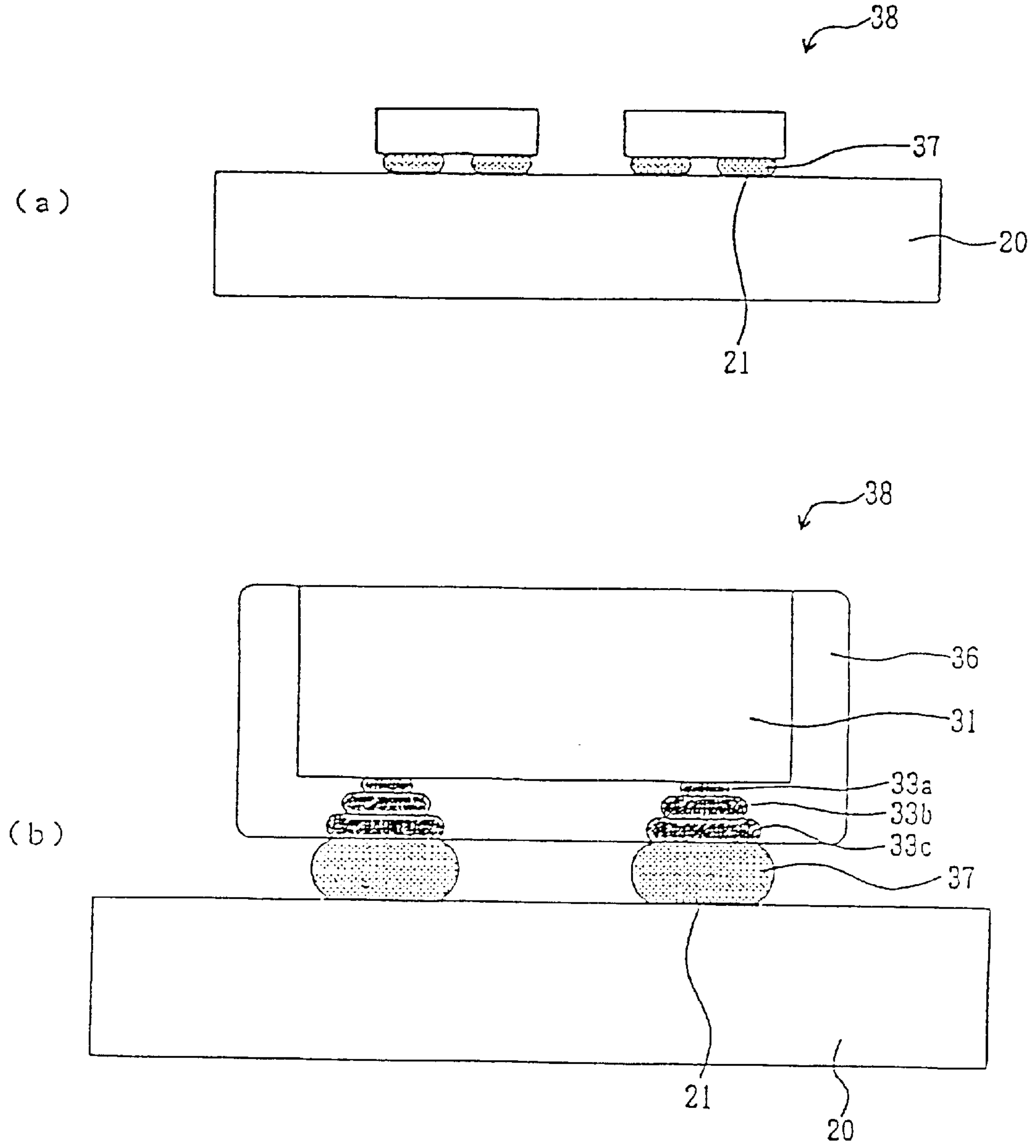
FIGS. 20*a* and 20*b* are cross-sectional views showing the semiconductor device shown in FIG. 19, which has been implemented on a mounting substrate.

FIG. 20 is a cross-sectional view of the semiconductor device according to the twelfth embodiment of the present invention, which has been mounted to a mounting substrate, wherein FIG. 20(*a*) is a sectional view showing the entire mounting of the semiconductor device to the mounting substrate, and FIG. 20(*b*) is an enlarged sectional view showing the manner in which the semiconductor device has been implemented to the mounting substrate.

As shown in these drawings, a semiconductor element 31 is electrically connected to substrate electrodes 21 of a mounting substrate 20 through conductive adhesives 37 while exposed or bare surfaces of metallic balls 33*a*, 33*b* and 33*c* are being placed down. Here, reference numeral 38 indicates the semiconductor device.

Figure 21:
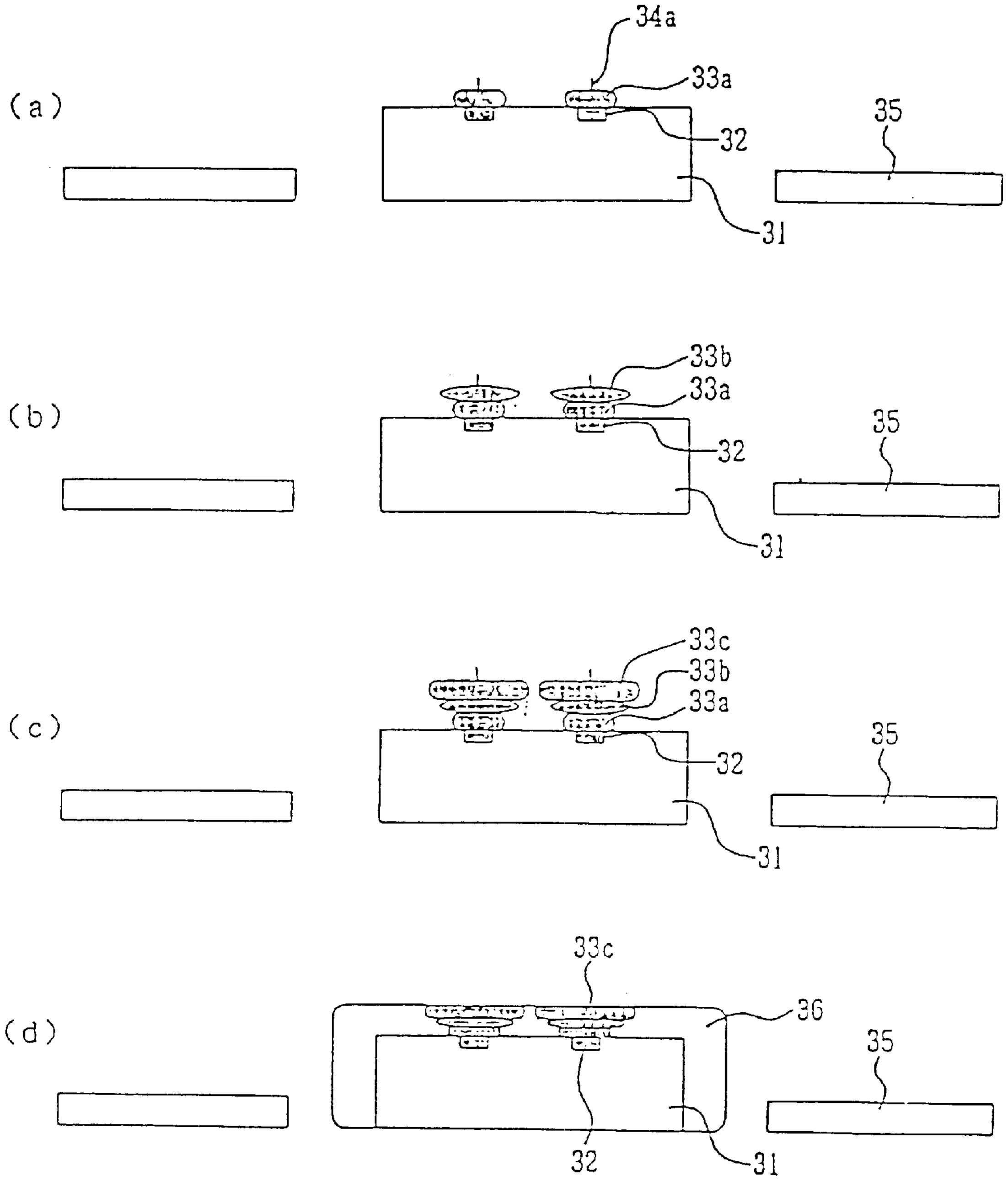
FIGS. 21*a*, 21*b*, 21*c*, and 21*d* are cross-sectional views for describing a process for manufacturing the semiconductor device shown in FIG. 19.

FIG. 21 is a cross-sectional view for describing a process of manufacturing the semiconductor device illustrating the twelfth embodiment of the present invention.

Figure 22:
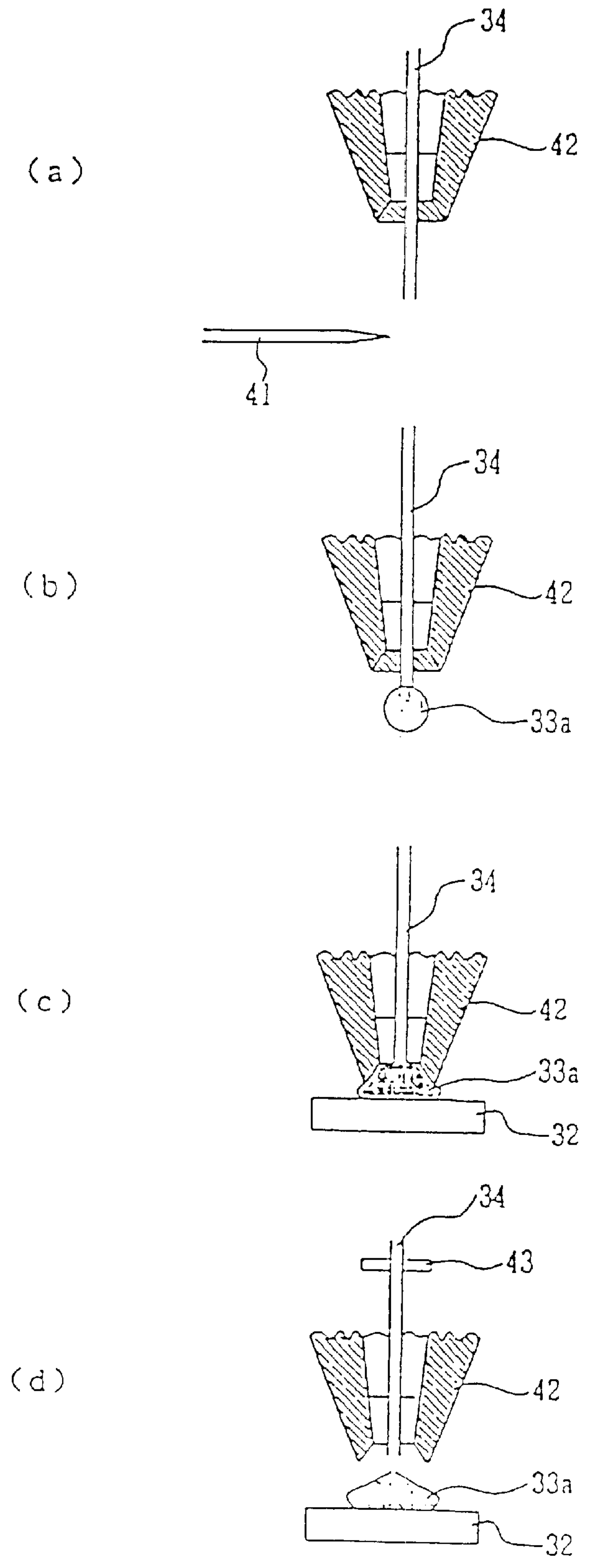
FIGS. 22*a*, 22*b*, 22*c*, and 22*d* are views for describing a method of forming a metal ball connected to an electrode of a semiconductor element.

(1) As shown in FIG. 21 (*a*), the metallic ball 33*a* is first formed on its corresponding electrode 32 of the semiconductor element 31 in a die padfee state. Reference numeral 34*a* indicates the remainder obtained by tearing off a metal thin line. A method of forming the metallic ball 33*a* will now be described as shown in FIG. 22. Namely, as shown in FIG. 22(*a*), the metallic ball 33*a* is formed on a metal thin line 34 extending from a bonding tool 42 by an electrical charge produced between an. electrical torch 41 and the metal thin line 34 as shown in FIG. 22(*b*). Next, as shown in FIG. 22(*c*), the bonding tool 42 drops so that the metallic ball 33*a* is bonded or joined to its corresponding electrode 32 of the heated semiconductor element by an ultrasonic wave and its own load. In this condition, a clamp 43 is closed to elevate the bonding tool 42 as shown in FIG. 22(*d*). In doing so, a force is applied to the immediately upper portion of the metallic ball 33*a* so as to cut the metallic thin line 34.

(2) Next, as shown in FIG. 21(*b*), the metallic ball 33*b* larger than the metallic ball 33*a* in size is formed on the metallic ball 33*a* in the same manner as described above.

(3) Further, as shown in FIG. 21(*c*), the metallic ball 33*c* larger than the metallic ball 33*b* in size is formed on the metallic ball 33*b*.

Incidentally, the above process steps (2) and (3) are repeated several times as needed.

(4) Next, as own in FIG. 21(*d*), the semiconductor element 31 is sealed with the plastic sealing material 36 in such a manner that the reverse side of the semiconductor element 31 is exposed. Since, at this time, each of the metallic balls 33*a* through 33*c* is held tight by a mold upon sealing, the remainder 34*a* of the metal thin line 34, which is located just above the top metallic ball 33*c*, is crushed. As a result, only the top metallic ball 33*c* is exposed from the surface of the plastic sealing material 36.

Further, the present invention has the following use forms.

The eleventh embodiment (see FIG. 16) shows an example in which each electrode of the semiconductor element is disposed substantially in the center of the semiconductor element. However, even if each electrode is disposed in any portion of the semiconductor element, its position is applicable to any portion thereof by changing the direction (a wiring angle of a wire loop) of each metal thin line.

The twelfth embodiment (see FIG. 19) shows an example in which the electrodes of the semiconductor element are disposed around the semiconductor element (at longitudinally-extending ends thereof). However, the electrodes may be applicable if they are disposed in any position of the semiconductor element.

According to the above-described embodiments, the following advantageous effects can be brought about:

(1) Since there is no by-lead connection, the outside shape of the semiconductor device can be reduced to the extent of that of the semiconductor element, whereby the semiconductor device can be reduced in size.

Since the semiconductor element is exposed outside, a high heat dissipation property is obtained.

Further, since each metal thin line is bared over a sufficient length, the area at which each metal thin line is connected to the mounting substrate can be greatly ensured. As a result, the reliability of junction therebetween can be enhanced.

Furthermore, since the thickness of the plastic sealing material on the semiconductor element is of the order of the height of a rising portion of each metal thin line, the resultant product can be greatly reduced in thickness as the semiconductor device.

(2) Since the metal thin lines are used as terminals for connections to the mounting substrate, a process of forming new connecting terminals (bumps or the like) can be omitted. Further, since the already-existing wire bonder can cope with the connecting process, the connecting terminals can be formed by the conventional facility. Thus, the manufacturing cost can be reduced.

Further, since the metal thin lines are held tight by the mold upon plastic sealing, the metal thin lines corresponding to the connecting terminals are disposed on the back of the plastic sealing portion at all times. It is therefore possible to easily and reliably materialize the exposure of each metal thin line.

(3) Since there is no by-lead connection, the outside shape of the semiconductor device can be reduced to the extent of that of the semiconductor element, whereby the semiconductor device can be reduced in size.

Since the semiconductor element is exposed outside, a high heat dissipation property is obtained.

Further, since the small metallic balls are used with respect to the electrodes of the semiconductor element, the area of each electrode of the semiconductor element can be reduced and the area of a circuit portion of the semiconductor element can be easily ensured. Accordingly, the semiconductor element can be brought into high integration.

Since the large metallic balls are used at the surface exposed portion, the area at which the mounting substrate is joined to each electrode, can be easily ensured.

Accordingly, the area for the connection between the mounting substrate and each electrode can be greatly ensured and the reliability of its connection can be enhanced.

Further, since the thickness of the plastic sealing material on the semiconductor element is of the order of the height of the stacked metallic balls, the resultant product can be greatly reduced in thickness as the semiconductor device.

(4) Since the metallic balls are used as terminals for connections to the mounting substrate, a process of forming new connecting terminals (bumps or the like) can be omitted. Further, since the already-existing wire bonder can cope with the connecting process by a simple change in software, the manufacturing cost (e.g., costs for introduction of new facilities) can be reduced.

Further, since the metallic balls are held tight by the mold upon plastic sealing, the metallic balls corresponding to the connecting terminals are disposed on the back of the plastic sealing portion at all times and are reliably exposed.

Furthermore, since the metallic balls are held tight by the mold in the same manner as described above, the remainder obtained by tearing off each metal thin line lying just above the top metallic ball of the metallic balls is also crushed in the same manner as described above. As a result, the exposed surface can be formed into a smooth surface free of bumps and dips.

Since the metallic ball on each electrode of the semiconductor element is provided in plural form upon holding the metallic ball tight by the mold, they serve cushioning functions and the stress exerted on the semiconductor element can be relaxed. It is therefore possible to avoid product defects caused by damage to the semiconductor element.

Moreover, since the polishing processes described in the paragraphs (1) and (2) referred to above can be omitted, the entire process can be simplified so that the assembly cost can be reduced.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor device, comprising:

a substrate having a first surface and a second surface, the first surface being opposite to the second surface;

a semiconductor element having an electrode, the semiconductor element being mounted on the first surface of the substrate;

a wire having first and second end portions, the first end portion being connected with the electrode of the semiconductor element and the second end portion being connected with the substrate;

a plurality of external connecting terminals provided on the second surface of the substrate;

a first sealing material formed on the first surface of the substrate and covering the second end portion of the wire, the first sealing material having a stress relaxing property; and a second sealing material which is in direct contact with, and seals, the semiconductor element, the first end portion of the wire and the first sealing material.

2. A semiconductor device according to claim 1, wherein the first sealing material seals the second end portion of the wire.

3. The semiconductor device according to claim 1, wherein the first sealing material includes silicon.

4. The semiconductor device according to claim 1, wherein the first sealing material is provided around the semiconductor element.

5. A semiconductor device, comprising:

a substrate having a first surface and a second surface, the first surface being opposite to the second surface;

a semiconductor element having an electrode, the semiconductor element being mounted on the first surface of the substrate;

a wire having first and second end portions, the first end portion being connected with the electrode of the semiconductor element and the second end portion being connected with the substrate;

a plurality of external connecting terminals provided on the second surface of the substrate;

a first sealing material embedded in the first surface of the substrate and having a stress relaxing property; and a resin which is in direct control with, and seals, the semiconductor element, the first end portion of the wire and the first sealing material.

6. The semiconductor device according to claim 5, wherein the first sealing material includes silicon.

7. The semiconductor device according to claim 5, wherein the first sealing material is provided around the semiconductor element.

8. The semiconductor device according to claim 5, wherein the substrate has a recess formed in the first surface, the first sealing material being disposed in the recess.

9. A semiconductor device, comprising:

a semiconductor element having a first surface and a second surface, the first surface being opposite to the second surface;

an electrode formed on the first surface of the semiconductor element;

a conductor formed on the electrode;

a metal thin line having a first portion and a second portion, the first portion of the metal thin line being connected with the conductor, the first portion extending in a first direction and the second portion extending in a second direction that is different from the first direction; and a sealing material which covers the first surface of the semiconductor element, the conductor and the first portion of the metal thin line, the second portion of the metal thin line being exposed from the sealing material, said sealing material having a substantially flat surface;

wherein the exposed surface of the second portion is disposed in a same plane as the flat surface of the sealing material, so that the exposed surface is adapted to serve as a terminal for connecting to a mounting substrate.

10. A semiconductor device according to claim 9, wherein the second portion of the metal thin line has a width substantially equal to a diameter of the metal thin line.

11. A semiconductor device according to claim 9, wherein the second surface of the semiconductor element is exposed from the sealing material.

12. A semiconductor device according to claim 9, wherein the second portion of the metal thin line is substantially parallel to the first surface of the semiconductor element.

13. A semiconductor device according to claim 9, further comprising:

a conductive material connected with the second portion of the metal thin line.

14. A semiconductor device, comprising:

a semiconductor element having a first surface and a second surface, the first surface being opposite to the second surface;

an electrode formed on the first surface of the semiconductor element;

a first conductor having a first diameter and being formed on the electrode;

a second conductor having a second diameter and being formed on the first conductor, wherein the second diameter is larger than the first diameter; and a sealing material which covers the first surface of the semiconductor element, the first conductor and a portion of the second conductor, said sealing material having a substantially flat surface;

wherein the exposed surface of the second conductor is disposed in a same plane as the flat surface of the sealing material and is flush with the flat surface of the sealing material, so that the exposed surface is adapted to serve as a terminal for connecting to a mounting substrate.

15. A semiconductor device according to claim 14, wherein the second surface of the semiconductor element is exposed from the sealing material.

16. A semiconductor device according to claim 14, further comprising:

a conductive material connected with the second conductor.

* * * * *